(12) United States Patent
Feng

(10) Patent No.: US 12,397,311 B2
(45) Date of Patent: Aug. 26, 2025

(54) LIQUID INJECTION DEVICE

(71) Applicant: SCIENTECH CORPORATION, Taipei (TW)

(72) Inventor: Chuan-Chang Feng, Taipei (TW)

(73) Assignee: SCIENTECH CORPORATION, Taipei (TW)

( * ) Notice: Subject to any disclaimer, the term of this patent is extended or adjusted under 35 U.S.C. 154(b) by 399 days.

(21) Appl. No.: 18/130,436

(22) Filed: Apr. 4, 2023

(65) Prior Publication Data

US 2024/0238823 A1 Jul. 18, 2024

(30) Foreign Application Priority Data

Jan. 16, 2023 (TW) ................... 112101708

(51) Int. Cl.
*B05B 15/531* (2018.01)
*F16K 23/00* (2006.01)
*H01L 21/67* (2006.01)

(52) U.S. Cl.
CPC ............ *B05B 15/531* (2018.02); *F16K 23/00* (2013.01); *H01L 21/67051* (2013.01); *H01L 21/6708* (2013.01)

(58) Field of Classification Search
CPC ....... B05B 15/58; B05B 15/531; B05B 15/52; H01L 21/67051; H01L 21/6708; F16K 23/00

(Continued)

(56) References Cited

U.S. PATENT DOCUMENTS 4,270,561 A * 6/1981 Bjorklund ............... F23K 5/147
137/107
6,082,629 A * 7/2000 Lee .......................... F16K 23/00
239/106

(Continued)

FOREIGN PATENT DOCUMENTS

CN 206527006 U 9/2017
CN 108435454 A 8/2018

(Continued)

OTHER PUBLICATIONS

Office Action dated Nov. 7, 2023 of the corresponding Taiwan patent application No. 112101708.

(Continued)

*Primary Examiner* — Steven J Ganey
(74) *Attorney, Agent, or Firm* — Chun-Ming Shih; HDLS IPR SERVICES

(57) ABSTRACT

A liquid injection device includes a nozzle, a moving element and a control valve. The nozzle has a channel, a bypass passage and a suck back passage. The channel penetrates through the nozzle for injecting a working fluid. The channel has a liquid outlet. The bypass passage has a first opening, a switch-on position and a switch-off position. The suck back passage has a second opening between the first opening and the liquid outlet. The first opening and the second opening communicate with the channel. The moving element is disposed in the bypass passage. The control valve is disposed on the nozzle and controls the moving element to switch between the switch-on position and the switch-off position to open or close the channel. A suck back pump sucks the working fluid remaining between the first opening and the liquid outlet when the moving element is located at the switch-off position.

11 Claims, 8 Drawing Sheets

(58) Field of Classification Search
USPC .... 239/106, 119, 586, 589; 251/63.5, 30.02; 222/571
See application file for complete search history.

(56) References Cited

U.S. PATENT DOCUMENTS

| | | | |
|---|---|---|---|
| 9,277,934 | B2 | 3/2016 | Kojima et al. |
| 2008/0086077 | A1* | 4/2008 | Seto ........................ B26F 3/004 604/48 |
| 2019/0388912 | A1* | 12/2019 | Kader ................. B05C 11/1039 |

FOREIGN PATENT DOCUMENTS

| | | |
|---|---|---|
| CN | 114849990 B | 9/2022 |
| JP | H11204416 A | 7/1999 |
| JP | 2001102346 A | 4/2001 |
| JP | 2022186637 A | 12/2022 |
| TW | 201244829 A | 11/2012 |
| TW | 201540378 A | 11/2015 |
| TW | 202226342 A | 7/2022 |
| WO | 2018037982 A1 | 3/2018 |

OTHER PUBLICATIONS

Office Action dated Mar. 12, 2024 of the corresponding Japan patent application No. 2023-032586.
Search Report dated Oct. 6, 2023 of the corresponding European patent application No. 23167574.5.

* cited by examiner

LIQUID INJECTION DEVICE

BACKGROUND

Technical Field

The disclosure relates to a liquid injection device, particularly to a liquid injection device used in the semiconductor field for sucking back the working fluid remaining in a nozzle.

Related Art

In the semiconductor field, it often needs to push the chemical liquid to the nozzle at the outlet end of the pipeline by the infusion pump of the liquid injection device to flow out, so as to coat or spray the liquid on the surface of the substrate to etch or clean the substrate. The effect of etching and the uniformity of cleaning are important factors affecting the success or failure of the process. Therefore, how to control the chemical liquid from dripping to affect the process quality when the infusion pump is switched off to stop the infusion and how to avoid dripping while the nozzle is moving are extremely important.

A related art for preventing fluid from dripping is to install a suck back valve in the fluid injection device. However, since the suck back valve is disposed at the outlet end of the fluid infusion pump and is far away from the outlet end of the pipeline, so its suck back force is limited and the remaining liquid in the pipeline is too much, which causes dripping down and leakage at the nozzle of the outlet of the pipeline. This situation may be more severe, especially when using liquids with different fluid properties such as viscosity, density, temperature, volatility, and surface tension. Therefore, how to ensure that the fluids with different fluid properties are completely switched off and the remaining fluid may not drip out when the nozzle is moving is a shortcoming that needs to be improved urgently.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

An object of the disclosure is to guarantee that the nozzle may not drip after the infusion is stopped, and to prevent the nozzle from dripping when the nozzle is moving.

To accomplish the above object, the disclosure provides a liquid injection device for injecting at least one working fluid. The liquid injection device includes a nozzle, at least one moving element, at least one control valve and a suck back pump. The nozzle has at least one channel, at least one bypass passage and at least one suck back passage. The channel penetrates through the nozzle for injecting the working fluid. A distal end of the channel is formed with a liquid outlet. The bypass passage has a first opening, a switch-on position, and a switch-off position. The suck back passage has a second opening. The first opening and the second opening communicate with the channel. The second opening is located between the first opening and the liquid outlet. The moving element is disposed in the bypass passage. The control valve is disposed on a side of the nozzle and controls the moving element to switch between the switch-on position and the switch-off position to open or close the channel. The suck back pump is connected to the suck back passage. The suck back pump sucks the working fluid remaining between the first opening and the liquid outlet when the moving element is located at the switch-off position.

In an embodiment of the disclosure, the control valve controls the moving element by a high-pressure gas to reciprocate between the switch-on position and the switch-off position.

In an embodiment of the disclosure, the control valve has a chamber and a switch-on opening, the moving element includes a separating plate and a rod connected with the separating plate, the separating plate is disposed in the chamber to divide the chamber into a first chamber and a second chamber, the switch-on opening communicates with the first chamber, the rod penetrates the control valve from the first chamber to be partially received in the bypass passage. When the high-pressure gas enters the first chamber through the switch-on opening, the high-pressure gas pushes the separating plate to move the moving element to the switch-on position.

In an embodiment of the disclosure, the control valve includes an elastic element disposed in the second chamber, the elastic element elastically abuts against between the separating plate and an inner wall of the chamber. When the separating plate is not pushed by the high-pressure gas, the elastic element pushes the separating plate to move he moving element to the switch-off position.

In an embodiment of the disclosure, the control valve further includes a switch-off opening, the switch-off opening communicates with the second chamber. When the high-pressure gas enters the second chamber via the switch-off opening, the high-pressure gas pushes the separating plate to move the moving element to the switch-off position.

In an embodiment of the disclosure, the liquid injection device further includes an elastic sealing member, the elastic sealing member is disposed at an end of the rod away from the separating plate. When the moving element is located at the switch-off position, the elastic sealing member abuts against an inner wall of the channel to close the channel.

In an embodiment of the disclosure, an amount of each of the channel, the bypass passage, the suck back passage, the moving element and the control valve is multiple to constitute multiple liquid injection pipeline sets, and each liquid injection pipeline set is independently arranged to transfer (or infuse) the different working fluids.

In an embodiment of the disclosure, the nozzle has a water injection passage penetrating through the nozzle and arranged parallelly to the channel.

In an embodiment of the disclosure, the liquid injection device further includes at least one connector disposed in the suck back passage and connected with the suck back pump through a soft tube.

In an embodiment of the disclosure, the bypass passage is perpendicular to the channel.

In an embodiment of the disclosure, an air pressure value of the suck back pump is between 0.5 kg/cm$^2$ and 4 kg/cm$^2$.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

The disclosure provides a liquid injection device for injecting at least one working fluid. Please refer to FIGS. 1-3. The liquid injection device of the disclosure includes a nozzle 10, at least one moving element 20, at least one control valve 30 and a suck back pump B. It should be noted that the working fluid applied to the disclosure may be, but not limited to, water, chemical liquid, or cleaning liquid, etc. Various chemical liquids have different fluid properties such as viscosity, density, temperature, volatility, surface tension, etc., and thus the liquid injection device of the disclosure may need to be used to prevent the nozzle from dripping, but the liquid injection device of the disclosure is not excluded from using for water or cleaning liquid as the working fluid.

Figure 1:
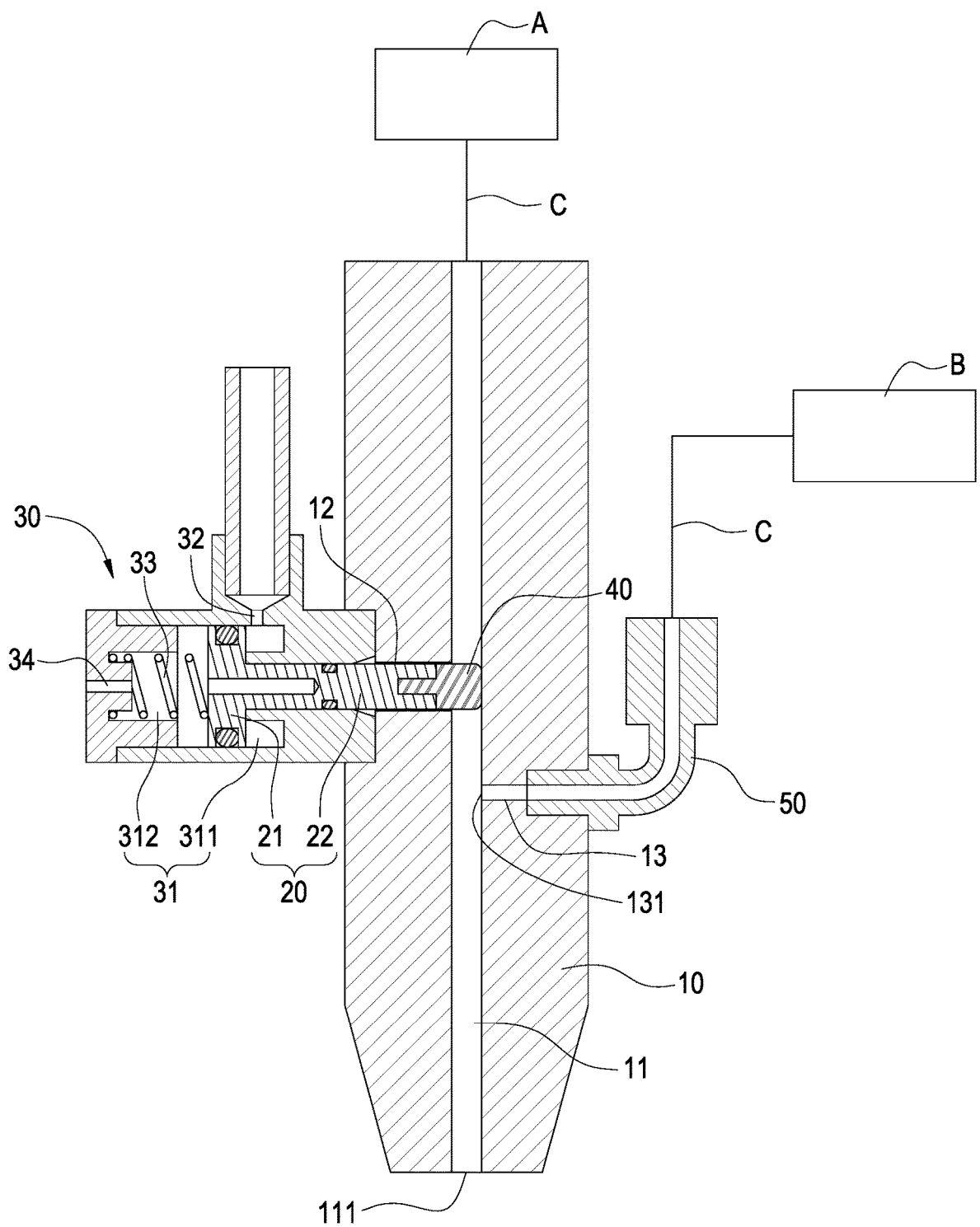
FIG. 1 is a cross-sectional view of the first embodiment of the disclosure.
Figure 2:
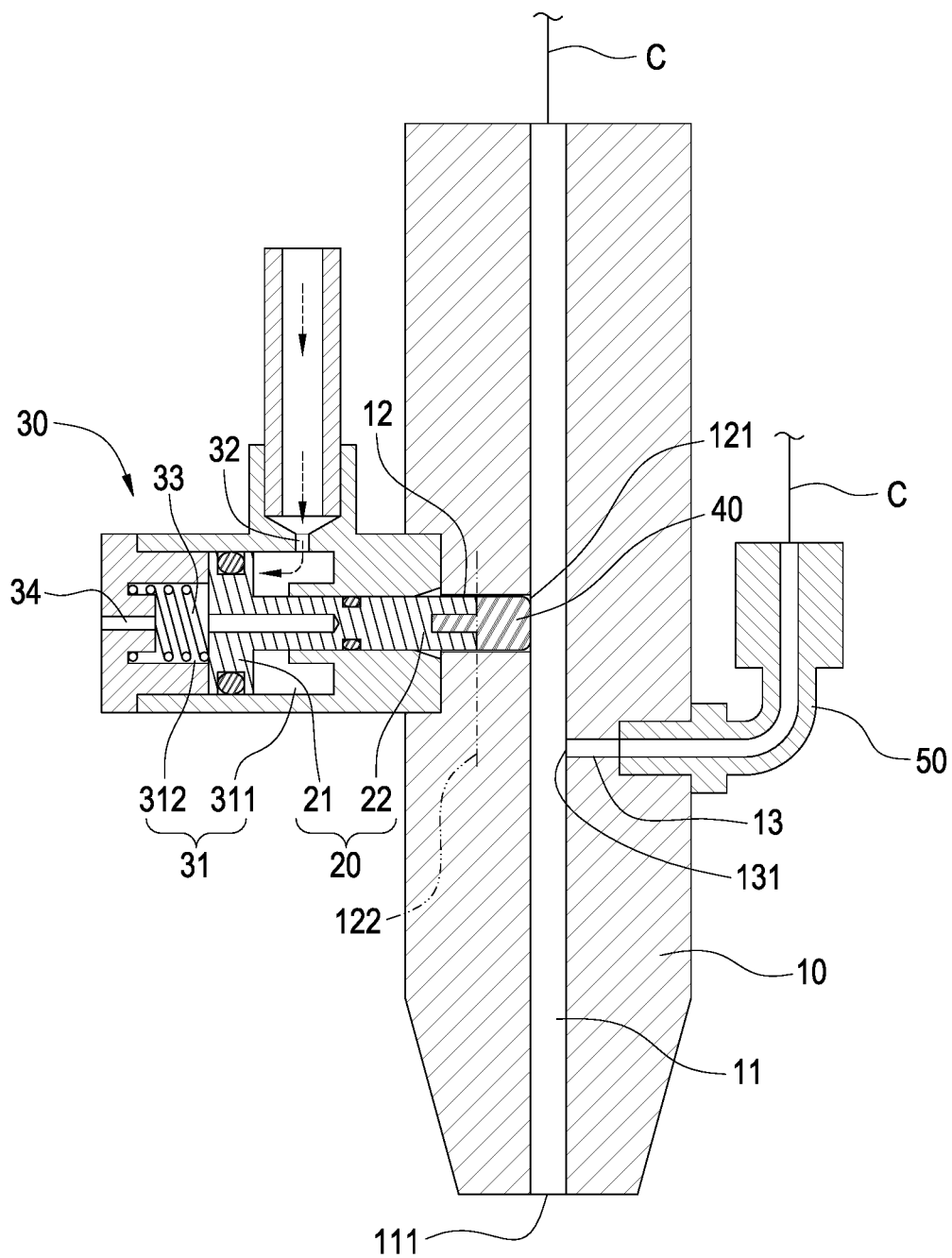
FIG. 2 is a schematic view of a using status of the first embodiment of the disclosure.
Figure 3:
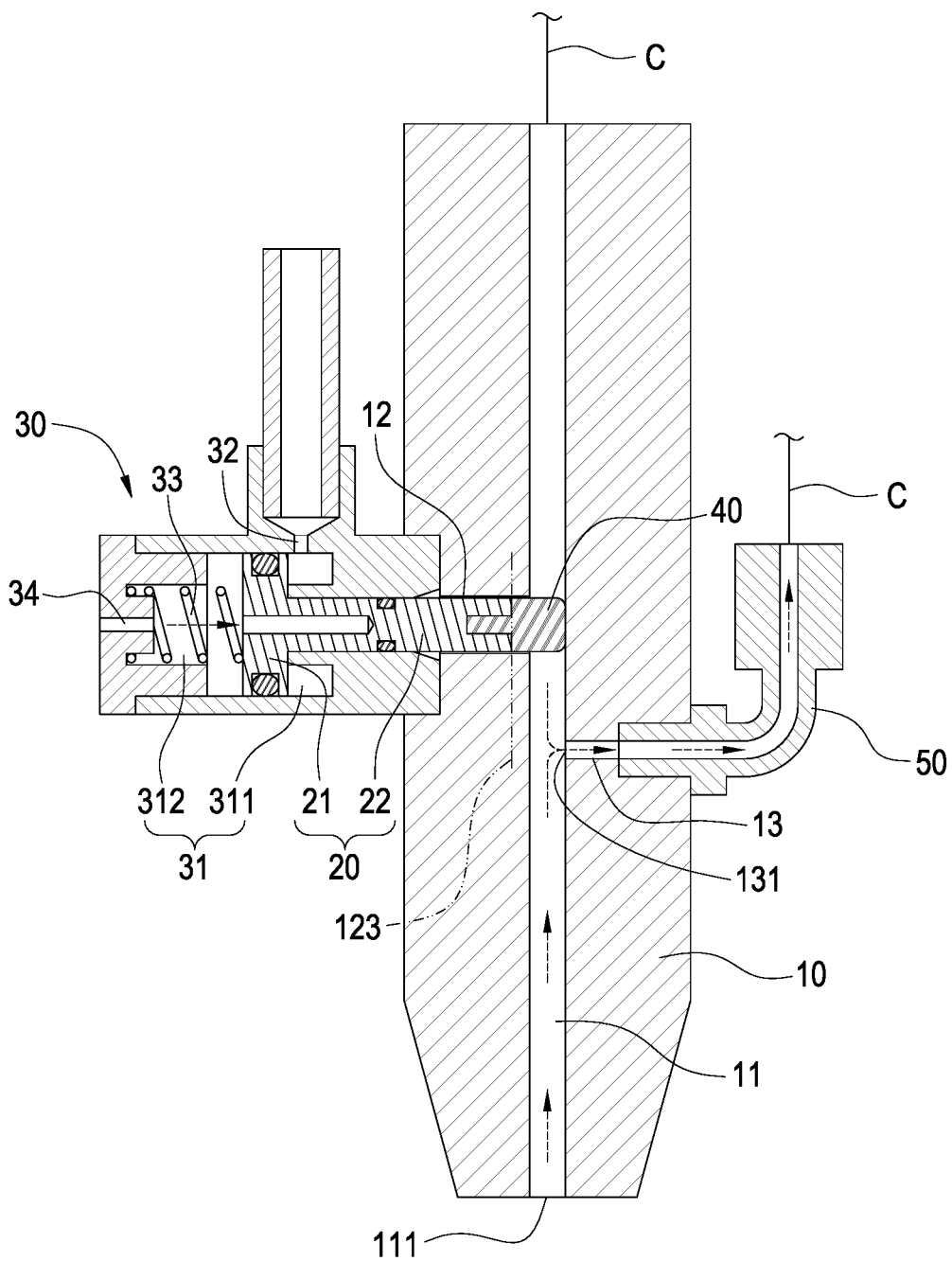
FIG. 3 is a schematic view of another using status of the first embodiment of the disclosure.

The nozzle 10 is of a rod shape. In the embodiment, the nozzle 10 is a cylinder and its distal end is of a conic shape, but not limited to this. The nozzle 10 has at least one channel 11, at least one bypass passage 12 and at least one suck back passage 13. The channel 11 longitudinally penetrates through the nozzle 10. A cross-section of the channel 11 may be, but not limited to, a straight line, a curve, or an irregular continuous arc. The channel 11 may use a soft tube C to be connected with a liquid infusion pump A to be able to inject the working fluid. A distal end of the channel 11 is formed with a liquid outlet 111, i.e., the liquid outlet 111 is located at a distal end of the nozzle 10. The bypass passage 12 has a first opening 121, a switch-on position 122 and a switch-off position 123. In FIGS. 1-3, the bypass passage 12 is structured by the switch-on position 122, the switch-off position 123 and the first opening 121 from left to right in order. The bypass passage 12 communicates with the channel 11 through the first opening 121. In the embodiment, the bypass passage 12 perpendicularly communicates with the channel 11, but not limited to this. The suck back passage 13 is connected to the suck back pump B through a soft tube C. The suck back passage 13 has a second opening 131. The suck back passage 13 communicates with the channel 11 through the second opening 131. The second opening 131 is located between the first opening 121 and the liquid outlet 111.

The moving element 20 is disposed in the bypass passage 12. The control valve 30 is disposed on a side of the nozzle 10. The control valve 30 may input a high-pressure gas (not labeled in figures) through a soft tube (not labeled in figures) to control the moving element 20 to reciprocate between the switch-on position 122 and the switch-off position 123 to open or close the channel 11. In detail, when the moving element 20 is at the switch-off position 123, the channel 11 is closed to make the working fluid be unable to pass. When the moving element 20 is at the switch-on position 122, the channel 11 is opened to make the working fluid be able to pass. When the moving element 20 is at the switch-off position 123, the suck back pump B sucks the working fluid remaining between the first opening 121 and the liquid outlet 111, so as to effectively guarantee the working fluid may not drip from the channel 11 and to prevent the working fluid from dripping when the liquid injection device of the disclosure is moving.

Furthermore, the control valve 30 has a chamber 31 and a switch-on opening 32, and the moving element 20 includes a separating plate 21 and a rod 22. The separating plate 21 is disposed in the chamber 31 to divide the chamber 31 into a first chamber 311 and a second chamber 312. The switch-on opening 32 communicates with the first chamber 311. An end of the rod 22 is connected with the separating plate 21 and penetrates the control valve 30 from the first chamber 311 to be partially received in the bypass passage 12. When the high-pressure gas enters the first chamber 311 through the switch-on opening 32, the high-pressure gas pushes the separating plate 21 to move the moving element 20 to the switch-on position 122.

Also, the control valve 30 further includes an elastic element 33 disposed in the second chamber 312. In the embodiment, the elastic element 33 is, but not limited to, a compression spring. Two ends of the elastic element 33 elastically abut against between the separating plate 21 and an inner wall of the chamber 31. In some embodiments, the control valve 30 further has a vent 34 communicating with the second chamber 312. Therefore, when the high-pressure gas pushes the separating plate 21 to move the moving element 20 to the switch-on position 122, the separating plate 21 compresses the elastic element 33 and the air in the second chamber 312 is ejected to the outside through the vent 34. When the channel 11 is closed for stopping flow, the control valve 30 sucks the high-pressure gas from the first chamber 311 via the switch-on opening 32, the separating plate 21 escapes from the pushing of the high-pressure gas to make the elastic element 33 push the separating plate 21 by the elasticity after being compressed, so as to move the moving element 20 to the switch-off position 123.

Figure 4:
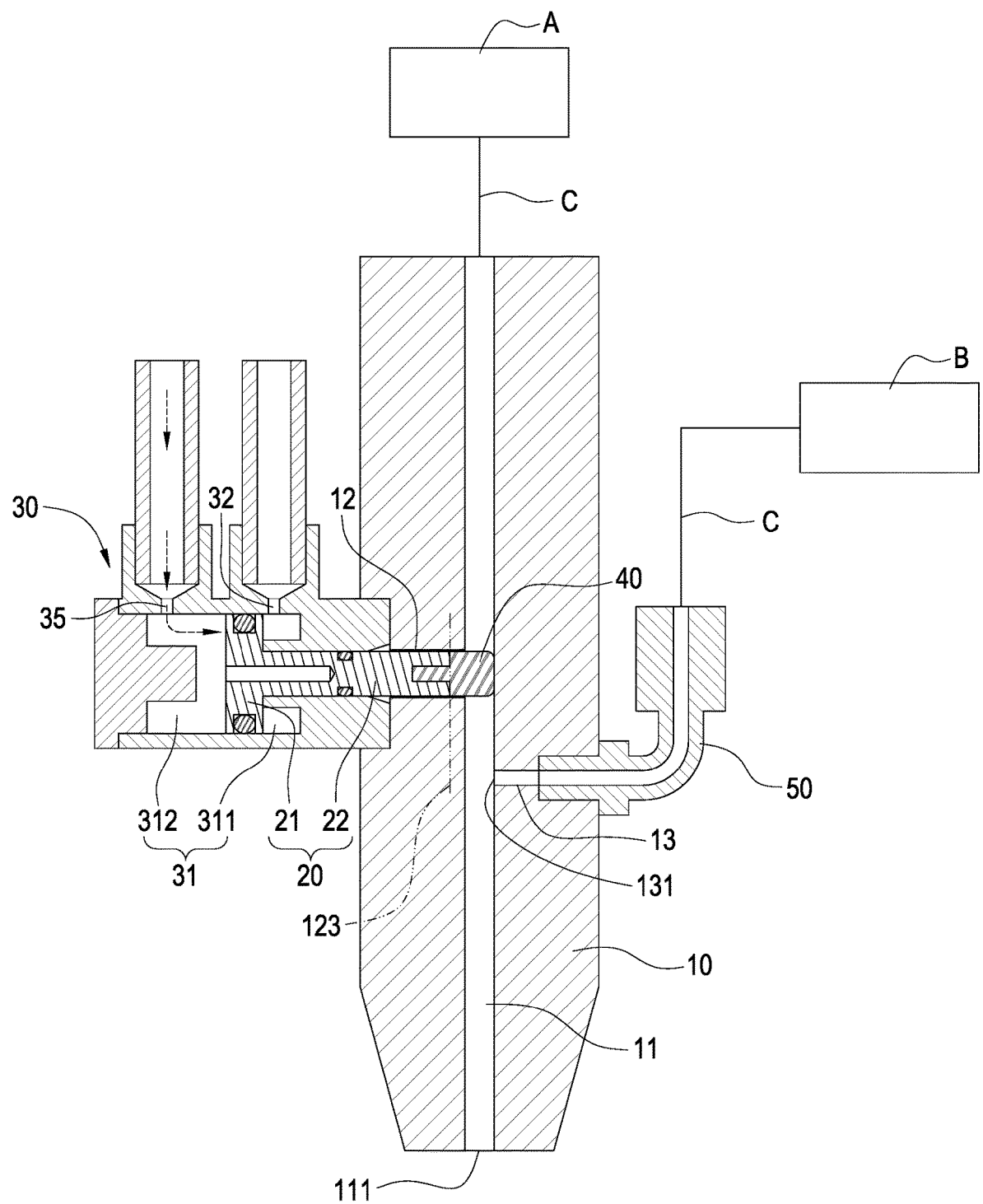
FIG. 4 is a cross-sectional view of the second embodiment of the disclosure.

Please refer to FIG. 4, which shows the second embodiment of the disclosure. Its primary difference with the first embodiment is not to adopt the elastic element 33, but the control valve 30 further has a switch-off opening 35. The switch-off opening 35 is located on a lateral side of the switch-on opening 32 and communicates with the second chamber 312. Therefore, when the channel 11 is closed for stopping flow, the control valve 30 sucks the high-pressure gas from the first chamber 311 via the switch-on opening 32, and the high-pressure gas is input into the second chamber 312 via the switch-off opening 35, so that the high-pressure gas pushes the separating plate 21 to move the moving element 20 to the switch-off position 123. In contrary, when the channel 11 is opened for restoring flow, the control valve 30 sucks the high-pressure gas from the second chamber 312 via the switch-off opening 35, and the high-pressure gas is input into the first chamber 311 via the switch-on opening 32, so that the high-pressure gas pushes the separating plate 21 to move the moving element 20 to the switch-on position 122.

Figure 8:
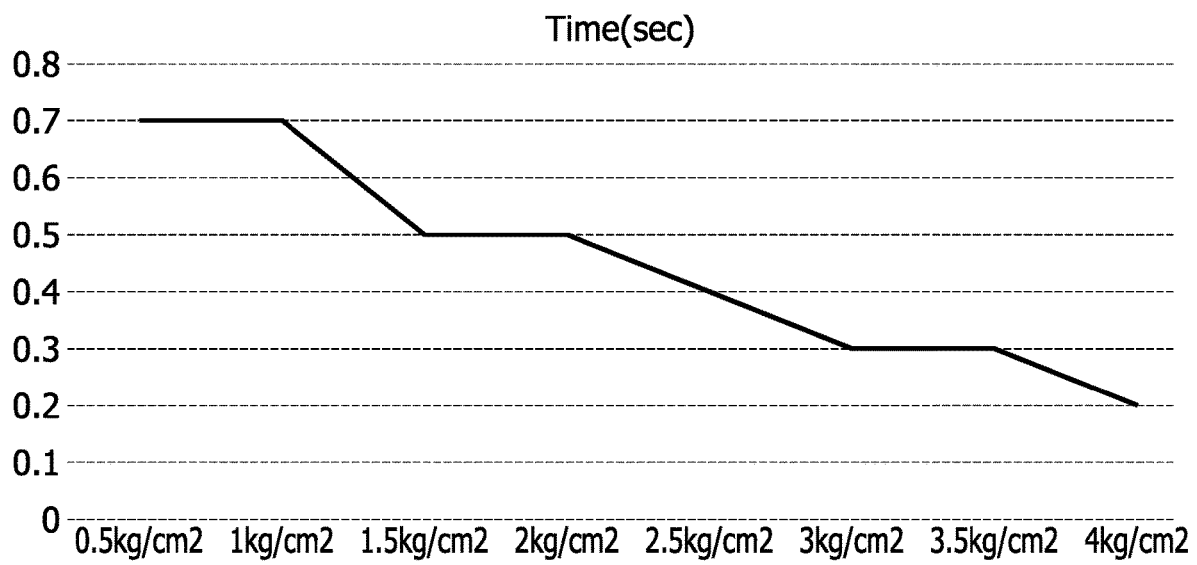
FIG. 8 is a data table and diagram of the suck back seconds of the disclosure.

In detail, the liquid injection device of the disclosure further includes an elastic sealing member 40 and a connector 50. The elastic sealing member 40 is disposed at an end of the rod 22 away from the separating plate 21. In the embodiment, the elastic sealing member 40 is, but not limited to, a rubber block. Therefore, when the moving element 20 is located at the switch-off position 123, the elastic sealing member 40 abuts against an inner wall of the channel 11 to close the channel 11, the elastic sealing member 40 may effectively ensure the sealing for closing the channel 11 by the elastic deformation. The connector 50 is disposed on the nozzle 10, communicates with the suck back passage 13, and is connected with the suck back pump B through a soft tube C, so as to suck and clear the remaining working fluid after the channel 11 is closed. The required time of the suck back pump B sucking and clearing the remaining working fluid is less if the suck back pressure of the suck back pump B is greater. In detail, please refer to FIG. 8, which is a data table and diagram of the required seconds at different suck back pressures. If it is set to start the suction pump B with a delay of 0.2 seconds for suction after closing the channel 11, when the pump air pressure value is 0.5 kg/cm$^2$, the required time is 0.7 seconds; when the pump air pressure value is 2 kg/cm$^2$, the required time is 0.5 seconds; and when the pump air pressure value is 3.5 kg/cm$^2$, the required time is 0.3 seconds. Thus, according to the data chart and diagram, the required time of sucking and clearing is less if the suck back pressure of the suck back pump B is greater.

Figure 5:
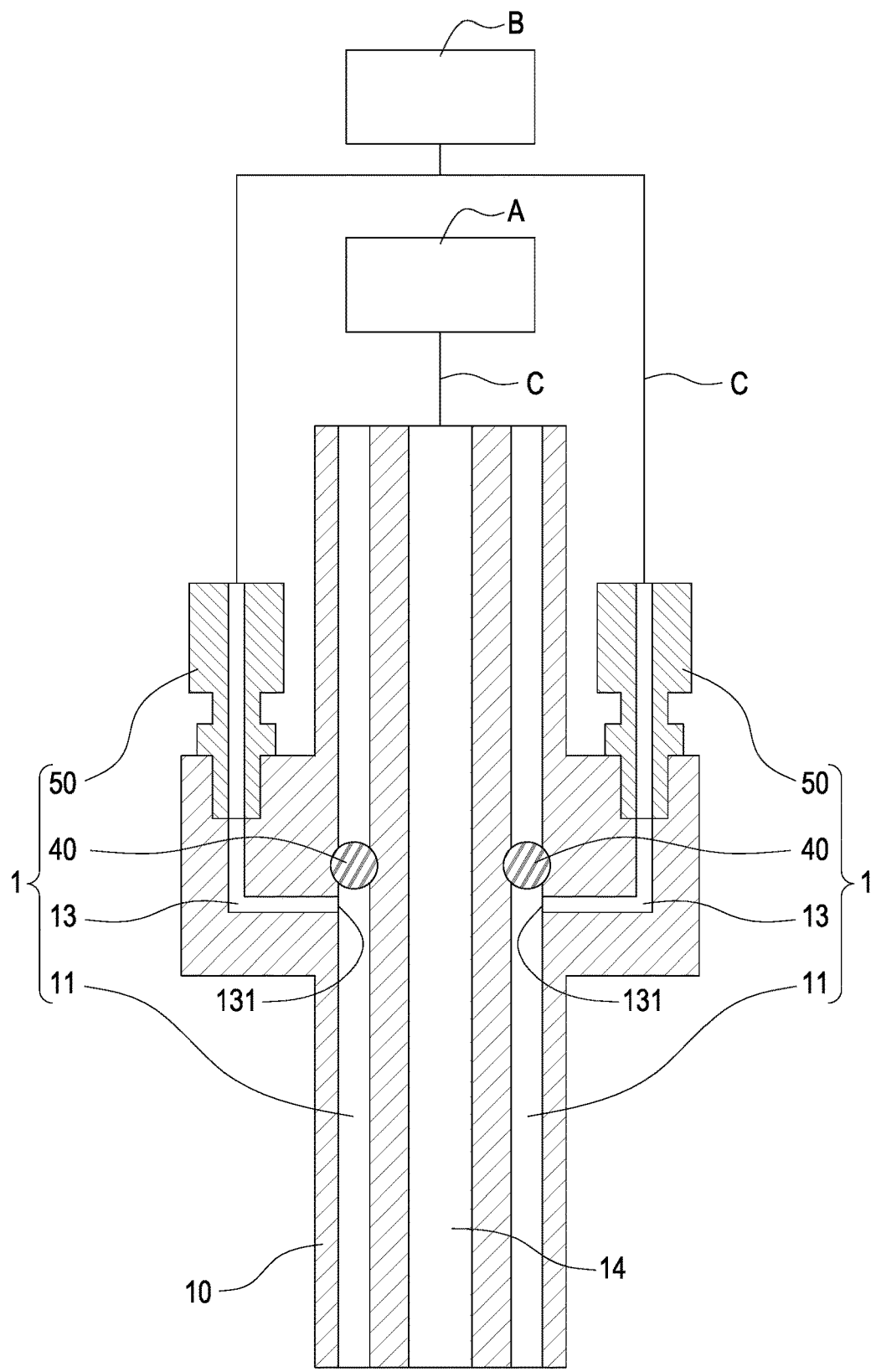
FIG. 5 is a cross-sectional view of the third embodiment of the disclosure.
Figure 6:
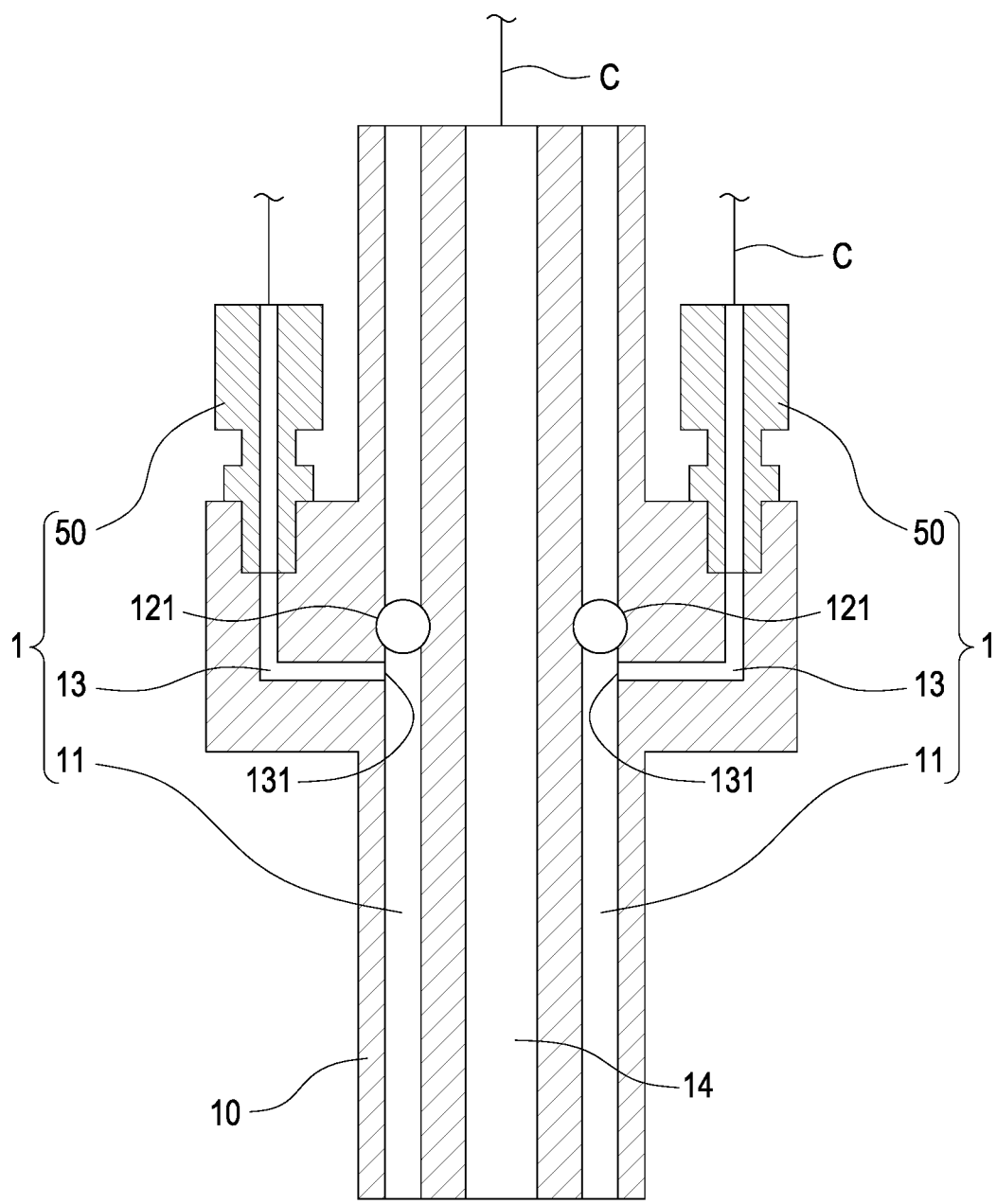
FIG. 6 is a schematic view of a using status of the third embodiment of the disclosure.
Figure 7:
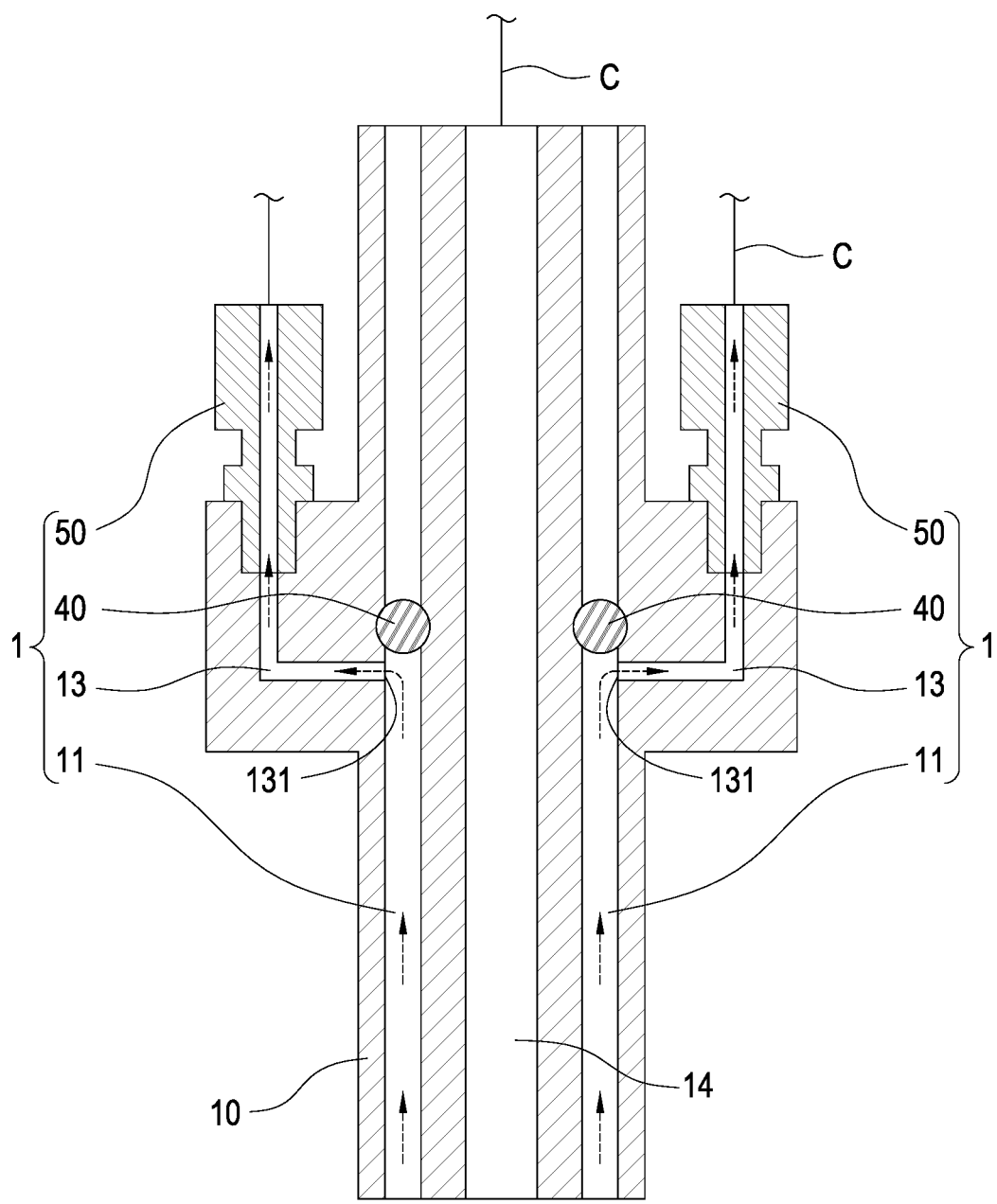
FIG. 7 is a schematic view of another using status of the third embodiment of the disclosure.

Please refer to FIGS. 5-7, which show the third embodiment of the disclosure. Its primary difference with the first embodiment and the second embodiment is that the number of each of the channel 11, the bypass passage 12, the suck back passage 13, the moving element 20 and the control valve 30 is multiple to separately constitute multiple liquid injection pipeline sets 1. Each liquid injection pipeline set 1 is independently arranged to transfer (or infuse) different working fluids (in the embodiment, different chemical liquids), so as to fulfill requirements of different manufacture processes of semiconductors. Also, the nozzle 10 in this embodiment further has a water injection passage 14 penetrating through the nozzle 10 and arranged parallelly to the channel 11 for exclusively infusing clear water for washing. Therefore, the liquid injection device of the embodiment may infuse different chemical liquids by each liquid injection pipeline set 1, and infuse clear water by the water injection passage 14 to accomplish diversified usage and prevent the liquid injection device from dripping chemical liquid.

It should be noted that because clear water has lower density, viscosity and surface tension, when the liquid infusion pump A stops supplying clear water, the remaining clear water in the valve nozzle structure may be sucked back along the water injection passage 14 by the pressure difference caused by the water hammer effect to avoid dripping. Thus, the water injection passage 14 can be prevented from dripping even though the liquid injection device is not disposed with the bypass passage 12 and the suck back passage 13.

While this disclosure has been described by means of specific embodiments, numerous modifications and variations could be made thereto by those skilled in the art without departing from the scope and spirit of this disclosure set forth in the claims.

What is claimed is:

1. A liquid injection device, configured to inject at least one working fluid, the liquid injection device comprising:
    a nozzle, comprising at least one channel, at least one bypass passage and at least one suck back passage, the channel penetrating through the nozzle for injecting the working fluid, a liquid outlet defined on a distal end of the channel, the bypass passage comprising a first opening, a switch-on position and a switch-off position, the suck back passage comprising a second opening, the first opening and the second opening communicating with the channel, and the second opening located between the first opening and the liquid outlet;
    at least one moving element, disposed in the bypass passage;
    at least one control valve, disposed on a side of the nozzle, configured to control the moving element to switch between the switch-on position and the switch-off position to open or close the channel; and
    a suck back pump, connected to the suck back passage;
    wherein the suck back pump is configured to suck the working fluid remaining between the first opening and the liquid outlet when the moving element is located at the switch-off position.

2. The liquid injection device of claim 1, wherein the control valve is configured to control the moving element by a high-pressure gas to reciprocate between the switch-on position and the switch-off position.

3. The liquid injection device of claim 2, wherein the control valve comprises a chamber and a switch-on opening, the moving element comprises a separating plate and a rod connected with the separating plate, the separating plate is disposed in the chamber to divide the chamber into a first chamber and a second chamber, the switch-on opening communicates with the first chamber, the rod penetrates the control valve from the first chamber to be partially received in the bypass passage, the high-pressure gas pushes the separating plate to move the moving element to the switch-on position when the high-pressure gas enters the first chamber through the switch-on opening.

4. The liquid injection device of claim 3, wherein the control valve comprises an elastic element disposed in the second chamber elastic element and elastically abuts against between the separating plate and an inner wall of the chamber, and the elastic element pushes the separating plate to move he moving element to the switch-off position when the separating plate is free from being pushed by the high-pressure gas.

5. The liquid injection device of claim 3, wherein the control valve further comprises a switch-off opening, the switch-off opening communicates with the second chamber, and the high-pressure gas pushes the separating plate to move the moving element to the switch-off position when the high-pressure gas enters the second chamber via the switch-off opening.

6. The liquid injection device of claim 3, further comprising an elastic sealing member disposed on an end of the rod away from the separating plate, and the elastic sealing member abuts against an inner wall of the channel to close the channel when the moving element is located at the switch-off position.

7. The liquid injection device of claim 1, wherein an amount of each of the channel, the bypass passage, the suck back passage, the moving element and the control valve is multiple to structure multiple liquid injection pipeline sets, and each liquid injection pipeline set is independently arranged to transfer different working fluids.

8. The liquid injection device of claim 1, wherein the nozzle comprises a water injection passage penetrating through the nozzle and arranged parallelly to the channel.

9. The liquid injection device of claim 1, further comprising at least one connector disposed in the suck back passage and connected with the suck back pump through a soft tube.

10. The liquid injection device of claim 1, wherein the bypass passage is perpendicular to the channel.

11. The liquid injection device of claim 1, wherein an air pressure value of the suck back pump is between 0.5 kg/cm$^2$ and 4 kg/cm$^2$.

\* \* \* \* \*